United States Patent
Shiu

(10) Patent No.: US 8,243,260 B2
(45) Date of Patent: Aug. 14, 2012

(54) LITHOGRAPHY APPARATUS

(75) Inventor: Wei-Cheng Shiu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 930 days.

(21) Appl. No.: 12/324,844

(22) Filed: Nov. 27, 2008

(65) Prior Publication Data

US 2010/0073651 A1    Mar. 25, 2010

(30) Foreign Application Priority Data

Sep. 22, 2008  (TW) ............................. 97136296 A

(51) Int. Cl.
G03B 27/72 (2006.01)
G03B 27/42 (2006.01)
G03B 27/54 (2006.01)

(52) U.S. Cl. ................. 355/71; 355/53; 355/67
(58) Field of Classification Search .......... 355/71, 355/53, 67
See application file for complete search history.

(56) References Cited

U.S. PATENT DOCUMENTS

| 2002/0075434 A1 | 6/2002 | Jiang | |
| 2006/0183310 A1* | 8/2006 | Tanaka | 438/597 |
| 2009/0040490 A1* | 2/2009 | Shigematsu et al. | 355/66 |
| 2010/0020303 A1* | 1/2010 | Unno | 355/71 |
| 2010/0188623 A1* | 7/2010 | Nakagawa | 349/96 |

FOREIGN PATENT DOCUMENTS

| CN | 1377468 A | 10/2002 |
| CN | 1894630 A | 1/2007 |
| JP | H05241324 | 9/1993 |

* cited by examiner

*Primary Examiner* — Peter B Kim
(74) *Attorney, Agent, or Firm* — Winston Hsu; Scott Margo

(57) ABSTRACT

A lithography apparatus includes: a light source comprising a first light beam and a second light beam, a photomask, a polarization controlling system positioned between the light source and the photomask, a wafer state for holding a wafer, and a lens positioned between the photomask and the wafer stage. The polarization controlling system diverts the first light beam into a first polarization direction and diverts the second light beam into a second polarization direction, wherein the first polarization direction and the second polarization direction are different from each other.

8 Claims, 3 Drawing Sheets

LITHOGRAPHY APPARATUS

BACKGROUND OF THE INVENTION

1. Field of the Invention

The present preferred embodiment relates to a lithography apparatus and, more particularly, to an apparatus which diverts the polarization direction of the incident light beam to at least two different polarization directions.

2. Description of the Prior Art

Lithography process is important in transferring circuit patterns onto a substrate. By projecting a light beam through a photo photomask onto a photoresist, and then exposing, developing, and etching the substrate, the substrate which is uncovered by the photoresist is removed. In this way, a pattern can be transferred onto the remaining substrate. As the integrity of the IC increases, the size of the semiconductor device should be scaled down as well. Therefore, it is an important issue to increase resolution of the lithographic process so as to form a semiconductor device with a smaller size.

A conventional method for improving resolution includes the steps of: off-axis illumination, immersion lithography and increasing the numerical aperture of the lens. In addition, some methods involve adjusting equipment parameters, such as adapting exposure energy and exposure time in order to achieve a better resolution and make a compromise between resolution and depth of focus. However, satisfactory results are not obtained.

Therefore, it is important to develop a lithography apparatus with improved resolution, and compatibility with current equipment.

SUMMARY OF THE INVENTION

Therefore, the present preferred embodiment provides a novel lithography apparatus with a polarization controlling system which diverts the polarization direction of the incident light beam to a direction parallel to the longest axis of a pattern on a photomask. In this way, the resolution of the lithography apparatus can be improved.

According to a preferred embodiment of the present preferred embodiment, the lithography apparatus includes: a light source comprising a first light beam and a second light beam; a photomask comprising a first pattern having a first set of multiple axes and a second pattern having a second set of multiple axes, wherein the first pattern has a first axis which is the longest axis among the first set of multiple axes of the first pattern and the second pattern has a second axis which is the longest axis among the second set of multiple axes of the second pattern, and wherein the direction of the first axis is different from the second axis; a polarization controlling system positioned between the light source and the photomask, wherein the polarization controlling system comprises a first polarization controlling unit and a second polarization controlling unit, wherein the first polarization controlling unit diverts a polarization direction of the first light beam to a direction which is parallel to the first axis, and the second polarization controlling unit diverts a polarization direction of the second light beam to a direction which is parallel to the second axis; a wafer stage for holding a wafer; and a lens positioned between the photomask and the wafer stage.

According to another preferred embodiment of the present preferred embodiment, the lithography apparatus includes: a light source comprising a first light beam and a second light beam; a photomask; a polarization controlling system positioned between the light source and the photomask, wherein the polarization controlling system diverts the first light beam to a first polarization direction and diverts the second light beam to a second polarization direction, wherein the first polarization direction and the second polarization direction are different from each other; a wafer stage for holding a wafer; and a lens positioned between the photomask and the wafer stage.

These and other objectives of the present preferred embodiment will no doubt become obvious to those of ordinary skill in the art after reading the following detailed description of the preferred embodiment that is illustrated in the various figures and drawings.

DETAILED DESCRIPTION

Figure 1:
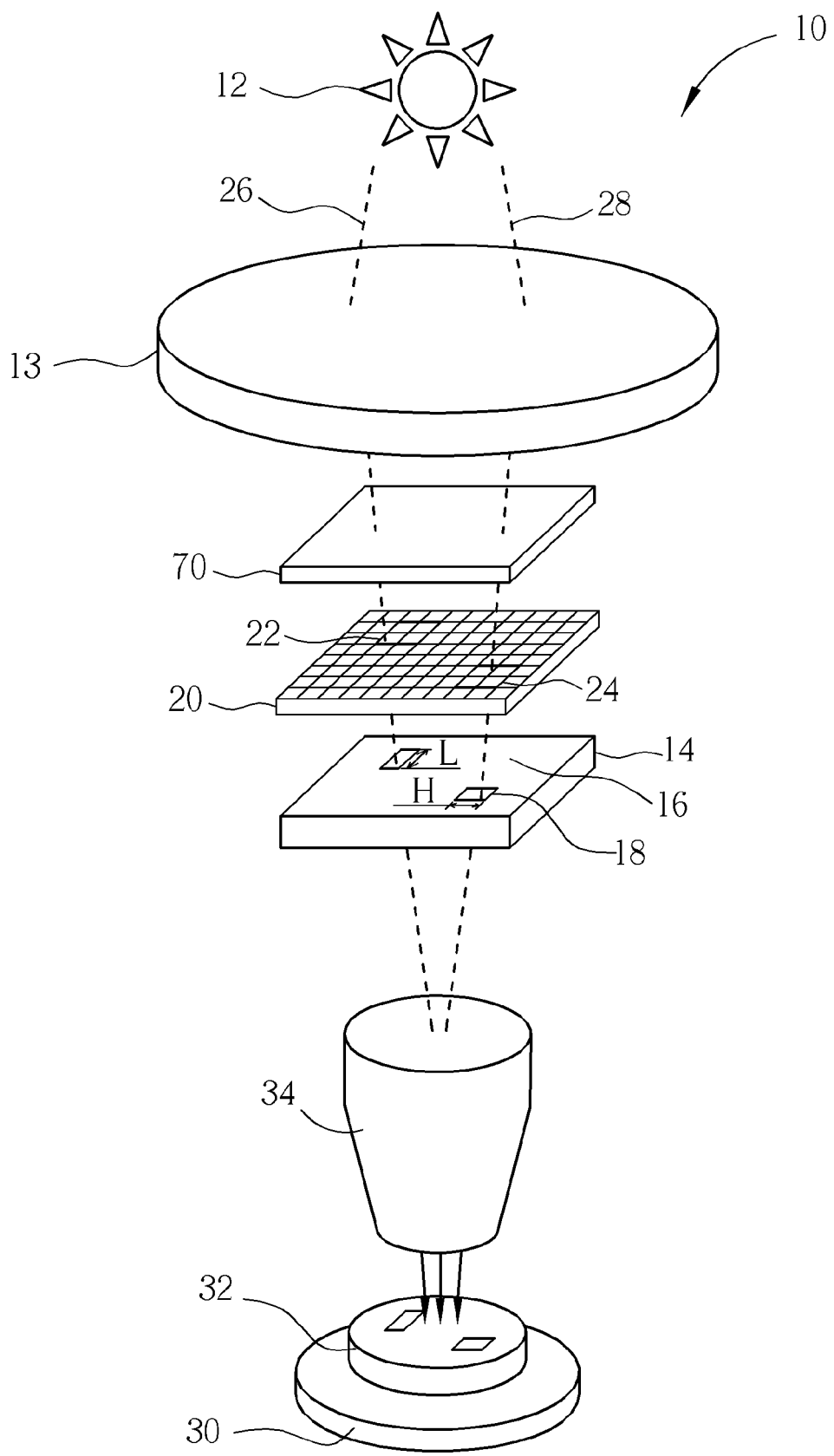
FIG. 1 shows the lithography apparatus of the present preferred embodiment.

FIG. 1 shows the lithography apparatus 10 of the present preferred embodiment. The lithography apparatus 10 includes a light source 12, a first lens 13, a photomask 14, a polarization controlling system 20, a wafer stage 30, and a second lens 34, which all of them are so arranged in such order for exposure light to pass through. The photomask 14 includes a first pattern 16 has a set of first multiple axes and a second pattern 18 has a set of second multiple axes. The first pattern 16 comprises a first axis L which is the longest axis among the set of first multiple axes of the first pattern 16 and the second pattern 18 comprises a second axis H which is the longest axis among the set of second multiple axes of the second pattern 18, where the direction of the first axis L is different from that of the second axis H. The polarization controlling system 20 is positioned between the light source 12 and the photomask 14, and the polarization controlling system 20 includes at least a first polarization controlling unit 22 and a second polarization controlling unit 24. The wafer stage 30 is for holding a wafer 32. The second lens 34 may be a project lens positioned between the photomask 14 and the wafer stage 30.

The first polarization controlling unit 22 corresponds to the first pattern 16, and the second polarization controlling unit 24 corresponds to the second pattern 18. In other words, the first polarization controlling unit 22 is for controlling the polarization direction of the incident light beam of the first pattern 16, and the second polarization controlling unit 24 is for controlling the polarization direction of the incident light beam of the second pattern 18. The feature of the present preferred embodiment is that: the first polarization controlling unit 22 diverts the polarization direction of the first light beam 26 emitted from the light source 12 to a first polarization direction. The second polarization controlling unit 24 diverts the polarization direction of the second light beam 28 emitted from the light source 12 to a second polarization direction. According to a preferred embodiment, the first polarization direction is parallel to the first axis L, and the second polarization direction is parallel to the second axis H.

In addition, the present preferred embodiment can be applied to the immersion lithography process by adding an immersion medium (not shown) between the second lens 34 and the surface of the wafer 32.

Although the above description only details the first polarization controlling unit 22 and the second polarization controlling unit 24, the polarization controlling system 20 of the present preferred embodiment is not limited to two polarization controlling units. The number of polarization controlling units can be adjusted according to different pattern designs.

According to the conventional technology, the light beam emitted from the light source can only be diverted to the same polarization direction, such as the X direction or Y direction, before entering the photomask. The conventional technology, does not offer a good result for a photomask with patterns having different features (patterns with their longest axis in different directions).

Based on the present preferred embodiment, however, the light beam emitted from the light source can be diverted to a plurality of polarization directions by polarization controlling units before entering the photomask. More particularly, the polarization direction of the light beam is diverted to that which is parallel to the longest axis of the pattern before entering the corresponding pattern. Therefore, the present preferred embodiment can provide a better resolution for a photomask with patterns having different features.

Figure 2:
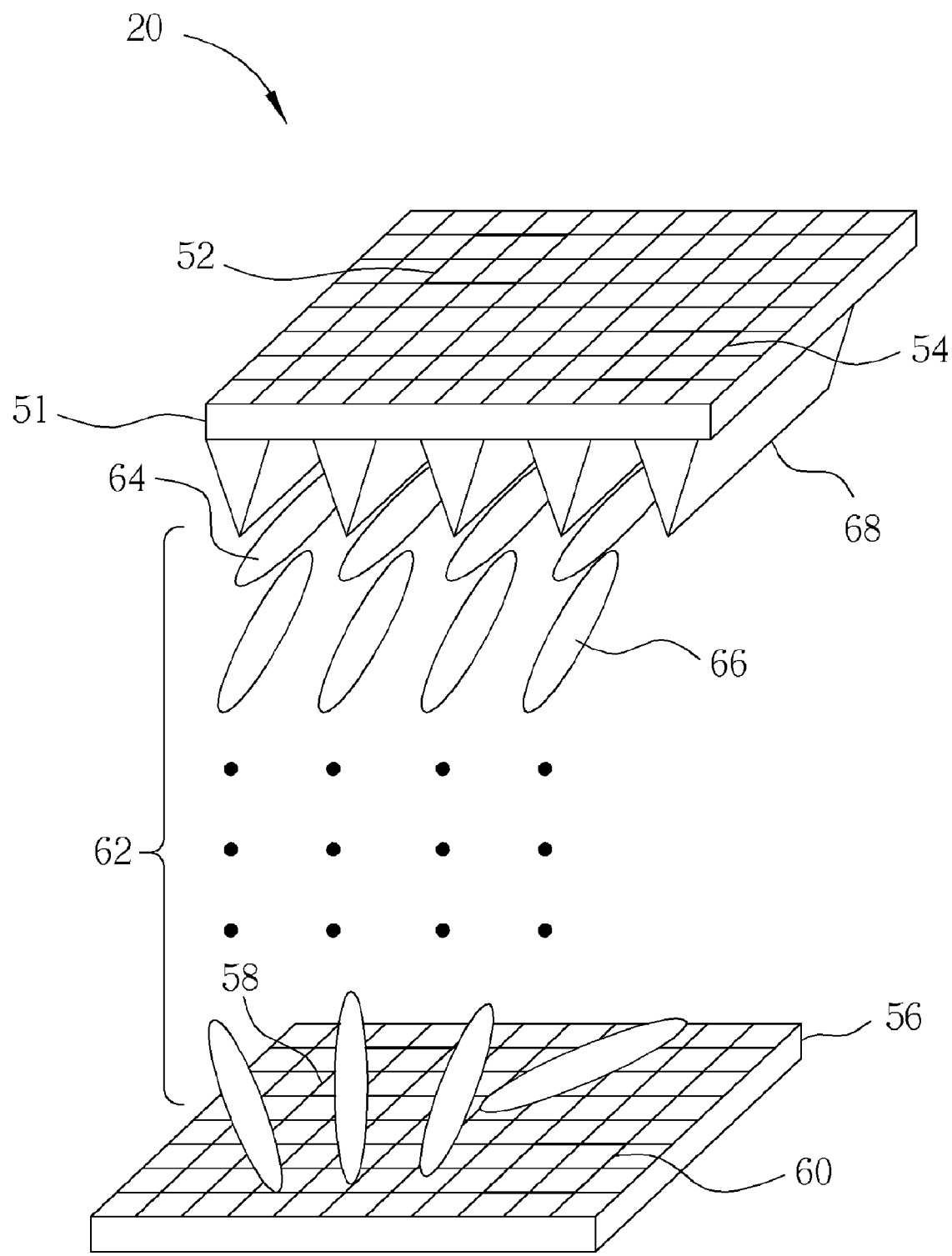
FIG. 2 shows a polarization controlling system according to a first embodiment of the present preferred embodiment.

FIG. 2 shows a polarization controlling system 20 according to the first embodiment of the present preferred embodiment. Please refer to FIG. 1 and FIG. 2. The polarization controlling system 20 includes a first substrate 51, a second substrate 56, and a liquid crystal layer 62. The liquid crystal layer 62 is positioned between the first substrate 51 and the second substrate 56. The first substrate 51 comprises a plurality of driving ICs, such as a first driving IC 52 and a third driving IC 54. The second substrate 56 comprises a plurality of driving ICs, such as a second driving IC 58 and a fourth driving IC 60. The liquid crystal layer 62 includes a plurality of first liquid crystal molecules 64 and a plurality of second liquid crystal molecules 66. The first driving IC 52 and the second driving IC 58 control the direction of the first liquid crystal molecules 64. The first driving IC 52, the second driving IC 58 and the first liquid crystal molecules 64 constitute the first polarization controlling unit 22. The third driving IC 54 and the fourth driving IC 60 control the direction of the second liquid crystal molecules 66. The third driving IC 54, the fourth driving IC 60 and the second liquid crystal molecules 66 constitute the second polarization controlling unit 24. According to a preferred embodiment of the present invention, the second driving IC 58 and the fourth driving IC 60 can be optionally provided. That is, the direction of the first liquid crystal molecules 64 can be controlled only by the first driving IC 52, and the direction of the second liquid crystal molecules 66 can be controlled only by the third driving IC 54.

In addition, an alignment film 68 may be placed between the first substrate 51 and the first liquid crystal molecules 64, and between the first substrate 51 and the second liquid crystal molecules 66. The alignment film 68 is for aligning the liquid crystal molecules. Furthermore, a linear polarizer 70 may be positioned between the light source 12 and the polarization controlling system 20. The linear polarizer 70 is for converting the polarization direction of the first light beam 26 and the second light beam 28 to a direction which is parallel to the alignment film 68 before the first light beam 26 and second light beam 28 enter the polarization controlling system 20. After the first light beam 26 and the second light beam 28 passing the linear polarizer 70, the polarization direction of the first light beam 26 and of the second light beam 28 turns parallel to the alignment film 68, and simultaneously parallel to the first liquid crystal molecules 64 which are parallel with and in contact with the alignment film 68 and to the second liquid crystal molecules 66 which are parallel with and in contact with the alignment film 68. Therefore, the first light beam 26 and the second light beam 28 can enter the polarization controlling system 20 completely without being blocked by the liquid crystal molecules of different directions. Then, the first liquid crystal molecules 64 without contacting the alignment film 68 and the second liquid crystal molecules 66 without contacting the alignment film 68 begin to rotate so as to change the polarization direction of the first light beam 26 and the second light beam 28 to a suitable direction such as a direction parallel to the first axis L and a direction parallel to the second axis H, respectively. The rotation of the first liquid crystal molecules 64 and the second liquid crystal molecules 66 is controlled by the above-mentioned driving ICs.

As described above, the polarization controlling system 20 actually has a plurality of polarization controlling units. That is, there are a plurality of driving ICs on the first substrate 51 and the second substrate 56 respectively for controlling the direction of the longest axis of the liquid crystal molecules in the liquid crystal layer 62.

Figure 3:
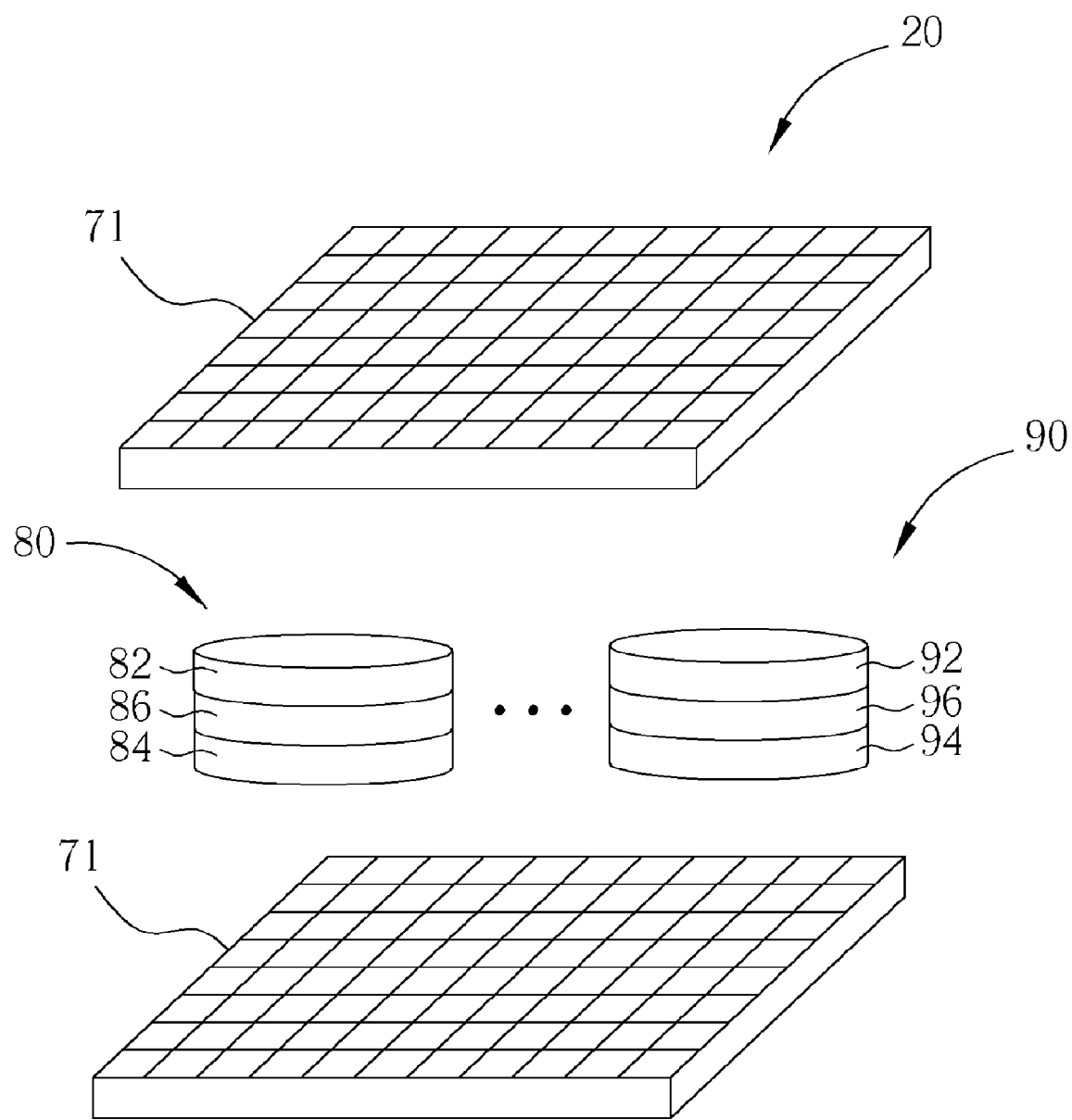
FIG. 3 shows a polarization controlling system according to a second embodiment of the present preferred embodiment.

FIG. 3 shows a polarization controlling system 20 according to the second embodiment of the present preferred embodiment. Please refer to FIG. 1 and FIG. 3 together. The polarization controlling system 20 includes a plurality of polarization controlling units, such as a first polarization controlling unit 22 and a second polarization controlling unit 24. The first polarization controlling unit 22 comprises a first wave plate 80 and a micro-electro-mechanical systems (MEMS) 71 adjacent to the first wave plate 80. The second polarization controlling unit 24 comprises a second wave plate 90 and the MEMS 71 adjacent to the second wave plate 90. The first wave plate 80 includes a first retardation optics 82, a first orientation optics 84 and a first optical interface 86. The first optical interface 86 is sandwiched between the first retardation optics 82 and the first orientation optics 84. The first retardation optics 82 is for diverting the polarization state of the first light beam 26 to linear polarization. The first orientation optics 84 is for diverting the polarization direction of the first light beam 26 to a first predetermined direction. The first optical interface 86 is for buffering the different refractive indices between the first retardation optics 82 and the first orientation optics 84. In this way, the light beam passing the first retardation optics 82 can be directed to the first orientation optics 84. The MEMS 71 is for rotating the first wave plate 80, such as the first retardation optics 82 and the first orientation optics 84.

The polarization state of the first light beam 26 can be diverted to linear polarization by rotating the first retardation optics 82, and the polarization direction of the first light beam 26 can be diverted to a first predetermined direction, for example a direction parallel to the first axis L, by rotating the first orientation optics 84.

The second wave plate 90 includes a second retardation optics 92, a second orientation optics 94 and a second optical interface 96. The second optical interface 96 is positioned between the second retardation optics 92 and the second orientation optics 94. The second retardation optics 92 is for diverting the polarization state of the second light beam 26 to linear polarization. The second orientation optics 94 is for diverting the polarization direction of the second light beam 96 to a second predetermined direction. The second optical interface 96 is for buffering the different refractive indices between the second retardation optics 92 and the second orientation optics 94. In this way, the light beam passing the second retardation optics 92 can be directed to the second orientation optics 94. The MEMS 71 is also for rotating the second wave plate 90, such as the second retardation optics 92 and the second orientation optics 94.

The polarization state of the second light beam 28 can be diverted to a second predetermined direction, for example a direction parallel to the second axis H, by rotating the second orientation optics 94. Although the above description only details the first polarization controlling unit 22 and the second polarization controlling unit 24, the polarization controlling system 20 is actually constituted of a plurality of polarization controlling units. That is, there are many wave plates placed adjacent to the MEMS to divert the polarization direction of light beam.

It is noteworthy that there is a plurality of polarization controlling units set on the polarization controlling system. For a photomask with different pattern features (patterns with their longest axis in different directions) the polarization controlling system can divert the polarization direction of the incident light beam to a suitable direction for the pattern. According to a preferred embodiment, the polarization direction is preferably parallel to the longest axis of a corresponding pattern. In this way, the resolution of the lithography apparatus can be improved.

Those skilled in the art will readily observe that numerous modifications and alterations of the device and method may be made while retaining the teachings of the invention.

What is claimed is:

1. A lithography apparatus comprising:
    a light source comprising a first light beam and a second light beam;
    a photomask comprising a first pattern having a first set of multiple axes and a second pattern having a second set of multiple axes, wherein the first pattern comprises a first axis which is the longest axis of the first set of multiple axes of the first pattern and the second pattern comprises a second axis which is the longest axis of the second set of multiple axes of the second pattern, and wherein the direction of the first axis is different from that of the second axis;
    a polarization controlling system positioned between the light source and the photomask, wherein the polarization controlling system comprises a first polarization controlling unit and a second polarization controlling unit, the first polarization controlling unit diverts a polarization direction of the first light beam to a direction parallel to the first axis, and the second polarization controlling unit diverts a polarization direction of the second light beam to a direction parallel to the second axis, wherein the first polarization controlling unit comprises:
        a first wave plate comprising:
            a first retardation optics for diverting the polarization state of the first light beam to linear polarization;
            a first orientation optics for diverting the polarization direction of the first light beam to a first predetermined direction; and
            a first optical interface positioned between the first retardation optics and the first orientation optics; and
            a first micro-electro-mechanical systems (MEMS) adjacent to the first wave plate, wherein the first MEMS is for rotating the first wave plate;
    a wafer stage for holding a wafer; and
    a lens positioned between the photomask and the wafer stage.

2. The lithography apparatus of claim 1, further comprising a linear polarizer positioned between the light source and the polarization controlling system.

3. The lithography apparatus of claim 1, wherein the first predetermined direction is parallel to the first axis.

4. The lithography apparatus of claim 1, wherein the first predetermined direction is parallel to the second axis.

5. The lithography apparatus of claim 1, wherein the second polarization controlling unit comprises:
    a second wave plate comprising:
        a second retardation optics for diverting the polarization state of the second light beam to linear polarization;
        a second orientation optics for diverting the polarization direction of the second light beam to a second predetermined direction; and
        a second optical interface positioned between the second retardation optics and the second orientation optics; and
    a second micro-electro-mechanical systems (MEMS) adjacent to the second wave plate, wherein the second MEMS is for rotating the second wave plate.

6. The lithography apparatus of claim 5, wherein the second predetermined direction is parallel to the first axis.

7. The lithography apparatus of claim 5, wherein the second predetermined direction is parallel to the second axis.

8. The lithography apparatus of claim 1, further comprising an immersion medium positioned between the lens and the wafer.

* * * * *